US010650198B2

(12) United States Patent
Shangguan et al.

(10) Patent No.: US 10,650,198 B2
(45) Date of Patent: May 12, 2020

(54) METHOD AND APPARATUS FOR DETECTING ANTI-SKIMMING ELECTROMAGNETIC INTERFERENCE

(71) Applicants: GRG BANKING EQUIPMENT CO., LTD., Guangzhou, Guangdong (CN); GRG BANKING IT CO., LTD., Guangzhou, Guangdong (CN)

(72) Inventors: Lixian Shangguan, Guangdong (CN); Wenchuan Gong, Guangdong (CN); Xiaofeng Jin, Guangdong (CN)

(73) Assignees: GRG BANKING EQUIPMENT CO., LTD., Guangzhou (CN); GRG BANKING IT CO., LTD., Guangzhou (CN)

( * ) Notice: Subject to any disclaimer, the term of this patent is extended or adjusted under 35 U.S.C. 154(b) by 29 days.

(21) Appl. No.: 16/094,472

(22) PCT Filed: May 8, 2017

(86) PCT No.: PCT/CN2017/083459
§ 371 (c)(1),
(2) Date: Oct. 18, 2018

(87) PCT Pub. No.: WO2017/193887
PCT Pub. Date: Nov. 16, 2017

(65) Prior Publication Data
US 2019/0122011 A1 Apr. 25, 2019

(30) Foreign Application Priority Data
May 9, 2016 (CN) .......................... 2016 1 0303887

(51) Int. Cl.
G06K 7/08 (2006.01)
G07F 19/00 (2006.01)
(Continued)

(52) U.S. Cl.
CPC ............. *G06K 7/087* (2013.01); *G01R 31/00* (2013.01); *G01R 31/001* (2013.01);
(Continued)

(58) Field of Classification Search
CPC ................................ G07F 19/00; G07D 11/60
(Continued)

(56) References Cited

U.S. PATENT DOCUMENTS

2007/0029994 A1* 2/2007 Dembo .............. G01R 31/3025
324/762.01
2013/0240625 A1* 9/2013 Hsu ..................... G01R 31/2829
235/438

* cited by examiner

Primary Examiner — Edwyn Labaze

(57) ABSTRACT

The present invention provides a method and an apparatus for detecting anti-skimming magnetic interference, wherein the method comprises the steps of: S1: generating an original magnetic strip signal; acquiring an interfered magnetic strip signal by combining the original magnetic strip signal and an interference signal of an electromagnetic interference source to be tested; S2: decoding the interfered magnetic strip signal to obtain a decoded parameter; and S3: determining whether an original magnetic strip parameter is consistent with the decoded parameter; if so, obtaining a first test result that the electromagnetic interference source is unqualified to satisfy a magnetic card reading device's requirement for electromagnetic interference; otherwise, obtaining a second test result that the electromagnetic interference source is qualified to satisfy the magnetic card reading device's requirement for electromagnetic interference whereby security of the magnetic card reading device can be enhanced and the magnetic card can be protected from being skimmed.

14 Claims, 1 Drawing Sheet

(51) Int. Cl.
*G06K 19/06* (2006.01)
*G01R 31/00* (2006.01)
*H04K 3/00* (2006.01)

(52) U.S. Cl.
CPC ....... *G06K 19/06206* (2013.01); *G07F 19/20* (2013.01); *G07F 19/2055* (2013.01); *H04K 3/825* (2013.01)

(58) Field of Classification Search
USPC .................. 235/379, 380, 375, 492, 487
See application file for complete search history.

METHOD AND APPARATUS FOR DETECTING ANTI-SKIMMING ELECTROMAGNETIC INTERFERENCE

FIELD OF THE INVENTION

The present invention relates to the field of electromagnetic detection, in particular, relates to a method and an apparatus for detecting anti-skimming electromagnetic interference.

BACKGROUND OF THE INVENTION

As ATMs (Automatic Teller Machine) and POS terminals are widely used in daily life, financial fraud and crime that make use of card information stolen by skimmers arranged near card readers or POS terminals (i.e., magnetic card reading devices) arises frequently. The skimmer is a card reader equipped with a memory device and it is capable of reading all magnetic strip information of a magnetic card (such as a bank card) and recording it. Generally, the skimmer is installed inside the card reading device or at the front end of the magnetic head of the magnetic card reading devices of ATMs or POS terminals. When a cardholder inserts a magnetic card into the card reading device, the magnetic card information will be acquired by the skimmer before the ATM or POS terminal starts the transaction with the magnetic card. The cardholder will not be aware of the stealing of the magnetic card information at all because the transaction will not suffer any disturbance. Besides, according to a report issued by Mercator, the loss caused by card skimming in USA every year has amounted up to several ten billion dollars and it is still on the rise.

Among techniques for preventing the card reading device from being skimmed, electromagnetic protecting field is generally set up inside the card reading device or at the front end of the magnetic head of the magnetic card reading device so as to disturb signals received by the skimmer, that is, an electromagnetic interference source is arranged inside the card reading device. However, once quality deficiency or fault of the electromagnetic interference source happens, card information is still in danger of being stolen from the magnetic card reading device. Therefore, it is necessary to test the interference source so as to prevent the magnetic card information being skimmed.

SUMMARY OF THE INVENTION

The embodiments of the present invention provide a method for detecting anti-skimming magnetic interference and thereby the interference source can be accurately tested to figure out whether the interference source can meet the requirement of magnetic interference or not. Consequently, the security of magnetic card can be enhanced and the skimming of card information can be prevented.

Embodiments of the present invention provide a method for detecting anti-skimming magnetic interference, comprising the steps of:
generating an original magnetic strip signal;
acquiring an interfered magnetic strip signal by combining the original magnetic strip signal and an interference signal of an electromagnetic interference source to be tested;
decoding the interfered magnetic strip signal to obtain a decoded parameter; and
determining whether an original magnetic strip parameter is consistent with the decoded parameter; if so, obtaining a first test result that the electromagnetic interference source is unqualified to satisfy a magnetic card reading device's requirement for electromagnetic interference; otherwise, obtaining a second test result that the electromagnetic interference source is qualified to satisfy the magnetic card reading device's requirement for electromagnetic interference.

Further, the step of acquiring a combined interfered magnetic strip signal particularly comprises the steps of:
acquiring the interference signal sent out by the electromagnetic interference source to be tested;
combining the original magnetic strip signal and the interference signal so as to obtain the interfered magnetic strip signal.

Particularly, the original magnetic strip signal is generated according to the pre-stored original magnetic strip parameter or is acquired by the magnetic card reading device.

Further, the method also comprises the steps of:
performing A/D (analog-to-digital) conversion on the interference signal of the electromagnetic interference source to be tested in order to obtain digitalized values of the interference signal;
computing an average voltage value according to the digitalized values of the interference signal;
determining interference strength of the electromagnetic interference source according to the average voltage value.

Further, the method also comprises the step of displaying the test result and/or the interference strength.

Correspondingly, embodiments of the present invention further provide an apparatus for detecting anti-skimming electromagnetic interference, comprising: a controller, a magnetic strip signal generating module, an electromagnetic interference receiver, a signal combining module and a magnetic strip decoding module;
the magnetic strip signal generating module is connected to the controller and is configured to generate an original magnetic strip signal and send the original magnetic strip signal to the signal combining module;
the electromagnetic interference receiver is configured to acquire the interference signal sent by the electromagnetic interference source to be tested and send the interference signal to the signal combining module; the signal combining module is connected to the magnetic strip signal generating module and the electromagnetic interference receiver respectively, and is configured to combine the received original magnetic strip signal and the interference signal so as to acquire the interfered magnetic strip signal and send the interfered magnetic strip signal to the magnetic strip decoding module;
the magnetic strip decoding module is connected to the signal combining module, and is configured to receive the interfered magnetic strip signal, decode the interfered magnetic strip signal and then send the decoded parameter to the controller;
the controller is connected to the magnetic strip decoding module and is configured to receive the decoded parameter and determine whether the original magnetic strip parameter corresponding to the original magnetic strip signal is consistent with the decoded parameter; if so, obtaining a first test result that the electromagnetic interference source is unqualified to satisfy a magnetic card reading device's requirement for electromagnetic interference, otherwise, obtaining a second test result that the electromagnetic interference source is qualified to satisfy the magnetic card reading device's requirement for electromagnetic interference.

Further, the magnetic strip signal generating module comprises a digital frequency synthesizer, a low-pass filter and an amplifier circuit; a control terminal of the digital frequency synthesizer is configured to be connected to the controller, an analog signal output port of the digital frequency synthesizer is connected to an input port of the low-pass filter, the output port of the low-pass filter is connected to the input port of the amplifier circuit, and an output port of the amplifier circuit is connected to the signal combining module;

or the magnetic strip signal generating module is a magnetic card reading device.

Further, the test apparatus also comprises a noise filter; and the magnetic strip decoding module is connected to the signal combining module via the noise filter.

Further, the apparatus comprises an A/D converter having an analog signal input port and a digital signal output port; the analog signal input port of the A/D converter is connected to output port of the noise filter or the interference signal output port of the electromagnetic interference receiver, the digital signal output port of the A/D converter is connected to the controller.

Still further, the apparatus also comprises a display controlling module which comprises a keypad device and a display screen;

the controller has a detected signal input port and a display output port;

the detected signal input port of the controller is connected to the keyboard device while the display output port of the controller is connected to the display screen.

The following benefits can be achieved by implementing embodiments of the present invention: the method and apparatus for detecting anti-skimming electromagnetic interference provided by the present invention can decode the interfered magnetic strip signal so as to obtain the decoded parameter and determine whether the original magnetic strip parameter corresponding to the original magnetic strip signal is consistent with the decoded parameter, wherein the interfered magnetic strip signal is generated by interfering the original magnetic strip signal with the electromagnetic interference source to be tested, in this way, it can be accurately figured out whether the electromagnetic interference source is qualified to satisfy the magnetic card reading device's requirement for electromagnetic interference or not. The method and apparatus allows inspectors to make further improvement on the electromagnetic interference source and to promote the security of the magnetic card reading devices so that the magnetic card information can be protected from being skimmed.

DETAILED DESCRIPTION OF THE PREFERRED EMBODIMENTS

The technical solutions in the embodiments of the present invention will be described hereinafter clearly and completely in combination with the accompanying drawings of the embodiments of the present invention. Apparently, the described embodiments are merely some but not all of the embodiments of the present invention. Based on the embodiments of the present invention, all other embodiments obtained by a skilled in the art without creative efforts shall fall within the protection scope of the present invention.

Figure 1:
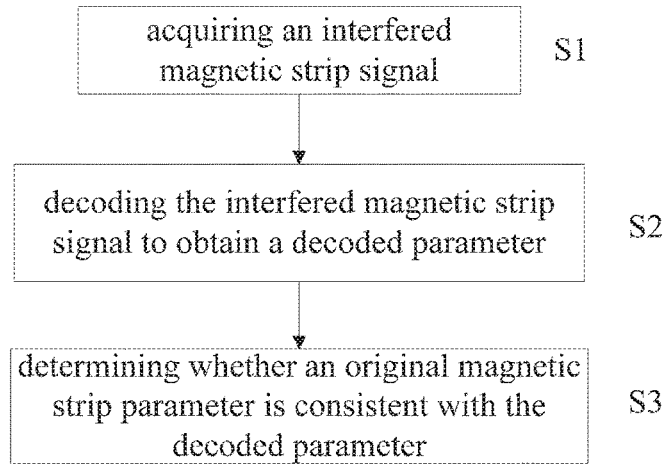
FIG. 1 is a flow chart of an embodiment of the method for detecting anti-skimming electromagnetic interference according to the present invention.
Figure 2:
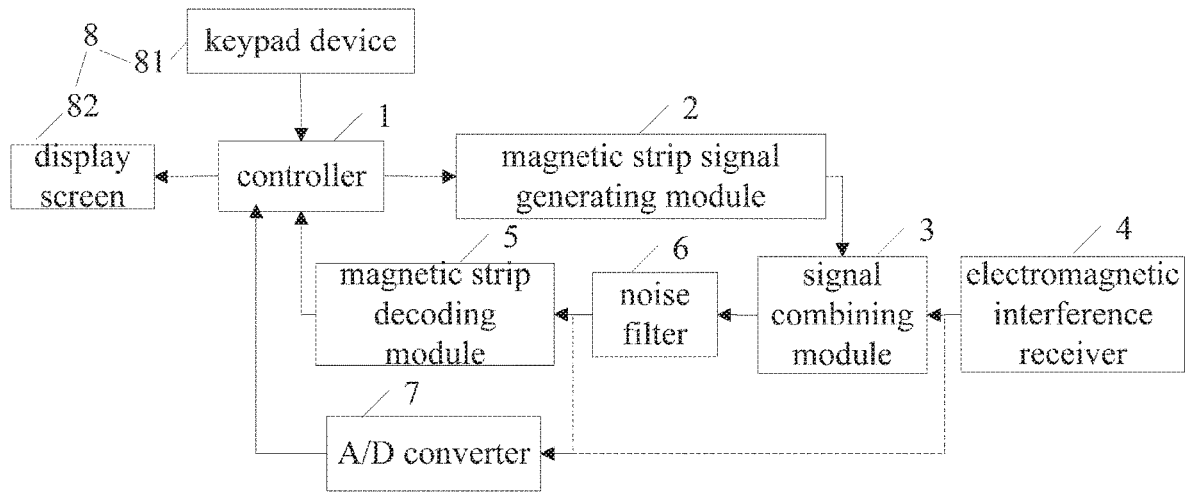
FIG. 2 is a schematic diagram of an embodiment of the apparatus for detecting anti-skimming electromagnetic interference according to the present invention.

Referring FIGS. 1-2, FIG. 1 is a flow chart of an embodiment of the method for detecting anti-skimming electromagnetic interference according to the present invention and FIG. 2 is a schematic diagram of an embodiment of the apparatus for detecting anti-skimming electromagnetic interference according to the present invention. The method can be performed by the apparatus for detecting anti-skimming electromagnetic interference shown in FIG. 2 and comprises following steps S1-S3.

S1: acquiring an interfered magnetic strip signal.

Among the means of acquiring the interfered magnetic strip signal in step S1, in an embodiment, an interfered magnetic strip signal may be generated by the test apparatus so as to facilitate the test of any electromagnetic interference source. Particularly, it comprises the following processes: firstly, when receives a detected signal, the controller 1 actuates the magnetic strip signal generating module 2 (may be a physical circuit or an integrated chip) to generate an original magnetic strip signal according to the pre-stored original magnetic strip parameter. In the present embodiment, the original magnetic strip parameter is the card number of the magnetic strip card and the original magnetic strip signal is in the form of an electronic signal of the card number of the original magnetic strip card.

Moreover, the electromagnetic interference receiver 4 is arranged nearby the magnetic card reading device in advance and the electromagnetic interference source in the magnetic card reading device to be detected starts to work. Alternatively, the electromagnetic interference receiver 4 is arranged nearby the electromagnetic interference source to be tested in advance and directly acquires the interference signal of the electromagnetic interference source when the controller 1 receives the detected signal.

Finally, the original magnetic strip signal generated by the magnetic strip signal generating module 2 and the interference signal received by the electromagnetic interference receiver 4 are sent to the signal combining module 3 (which can be a physical circuit or an integrated chip), the signal combining module 3 combines the received original magnetic strip signal and the interference signal so as to obtain the interfered magnetic strip signal. Thereby, an interfered magnetic strip signal being interfered by the interference source to be tested is generated by the test apparatus directly, and there is no need to obtain the interfered magnetic strip signal on the basis that the magnetic card reading device reads the magnetic card and sends the magnetic strip signal, which facilitates the test of the electromagnetic interference source in the situation without a magnetic card reading device (such as a card reader or a POS terminal).

In another embodiment, the original magnetic strip signal is obtained by the magnetic reading device (such as a card reader or a POS terminal), that is, when the card reading device reads the magnetic card information, the original magnetic strip signal of the card is generated and sent to the signal combining module 3 via the line between the magnetic card reading device and the test apparatus. Meanwhile, the electromagnetic interference receiver 4 outputs the received interference signal to the signal combining module 3 and the signal combining module 3 combines the received original magnetic strip signal and the interference signal to generate the interfered magnetic strip signal.

S2: decoding the interfered magnetic strip signal to obtain a decoded parameter.

Regarding realization of step S2, the magnetic strip decoding module 5 can be employed to decode the acquired interfered magnetic strip signal. After decoding, the output data are the decoded parameter, which can be the card number of the magnetic card or the bank card. Besides, before decoding, a filter can be arranged in the test apparatus or at the input port of the magnetic strip decoding module 5 so that the noise interference of the interfered magnetic strip signal can be filtered out and further decoding can be facilitated consequently.

S3: determining whether the original magnetic strip parameter is consistent with the decoded parameter; if so, obtaining a first test result that the electromagnetic interference source is unqualified to satisfy a magnetic card reading device's requirement for electromagnetic interference, otherwise, obtaining a second test result that the electromagnetic interference source is qualified to satisfy the magnetic card reading device's requirement for electromagnetic interference.

It should be noted that the magnetic strip decoding module 5 sends the decoded parameter to the controller 1 and corresponding software can be installed in the controller 1 so as to realize test determination and corresponding software can also be arranged to drive the magnetic strip signal generating module 2. When the original magnetic strip parameter is determined as consistent with the decoded parameter, decoding succeeds, which means the electromagnetic interference source cannot meet the magnetic card reading device's requirement for electromagnetic interference, so the electromagnetic interference source is disable to prevent the magnetic card information from being skimmed when the magnetic card reading device reads the magnetic card; otherwise, when the original parameter is determined as inconsistent with the decoded parameter, decoding fails, which means the electromagnetic interference source can meet the magnetic card reading device's requirement for electromagnetic interference, so the electromagnetic interference source is able to prevent the magnetic card information from being skimmed when the magnetic card reading device reads the magnetic card.

Preferably, the method also includes a step of detecting interference strength of the interference signal from the electromagnetic interference source, which can be realized in the following way: an A/D converter 7 is arranged inside the test apparatus to perform A/D conversion on the interference signal, and digitalized values of the interference signal are output to the controller 1;

the controller 1 computes the average voltage value of the interfered magnetic strip signal by using a corresponding algorithm module according to the digitalized values, i.e., the magnitude of the signal, generally, a number of magnitude values are successively sampled and the mean of them is taken as the average voltage value;

controller 1 converts the average voltage value to interference strength of the electromagnetic interference source, specifically, the average voltage value can be taken as the interference strength directly, or the interference strength can be calculated in proportion with the average voltage value.

Furthermore, the controller 1 displays the test result and the interference strength on the display screen to inform staff about the test result directly and clearly.

By performing the method of the embodiments of the present invention, the interfered magnetic strip signal can be decoded and thereby the decoded parameter can be obtained, wherein the interfered magnetic strip signal is generated by interfering the original magnetic strip signal with the interference from the electromagnetic interference source to be tested. Then, whether the original magnetic strip parameter corresponding to the original magnetic strip signal is consistent with the decoded parameter can be determined, and thereby whether the electromagnetic interference source is capable of satisfying the magnetic card reading device's requirement for electromagnetic interference can be accurately tested. In this way, further improvement of the electromagnetic interference source can be facilitated, the security of the magnetic card reading device can be enhanced and the magnetic card can be protected from being skimmed.

Referring FIG. 2, structure of the test apparatus that implements the above mentioned method will be described in detail hereinafter.

The apparatus for detecting the anti-skimming electromagnetic interference comprises: a controller 1, a magnetic strip signal generating module 2, a signal combining module 3, an electromagnetic interference receiver 4 and a magnetic strip decoding module 5;

wherein the controller 1 has a controlling terminal and a decoded parameter input port; the magnetic strip signal generating module 2 has a controlled terminal and a magnetic strip signal output port; the signal combining module 3 has a first input port, a second input port and a combined signal output port, the electromagnetic interference receiver 4 has an interference signal input terminal for receiving the interference signal from the electromagnetic interference source to be tested and an interference signal output port, the magnetic strip decoding module 5 has an input port for a signal to be decoded and an decoded parameter output port; the controlling terminal of the controller 1 is connected to the controlled terminal of the magnetic strip signal generating module 2, the magnetic strip signal output port of the magnetic strip signal generating module 2 is connected to the first input port of the signal combining module 3, the interference signal output port of the electromagnetic interference receiver 4 is connected to the second input port of the signal combining module 3, the combined signal output port of the signal combining module 3 is connected to the input port for the signal to be decoded of the magnetic strip decoding module 5, and the decoded parameter output port of the magnetic strip decoding module 5 is connected to the decoded parameter input port of the controller 1.

It should be noted that when a detected signal is received by the controller 1, it drives the magnetic strip signal generating module 2 to generate a magnetic strip signal, and then the magnetic strip signal generating module 2 outputs the magnetic strip signal to the signal combining module 3. Meanwhile, the electromagnetic interference receiver 4 sends the received interference signal to the signal combining module 3 and the signal combining module 3 combines the received two signals so as to get an interfered magnetic strip signal, in this way, a signal generated under the interference from the interference source to be tested can be obtained. Finally, the interfered magnetic strip signal is sent to the magnetic strip decoding module 5 for decoding so as to obtain a decoded parameter. The decoded parameter is transmitted to the controller 1, and then the controller 1 compares the decoded parameter with the original magnetic strip parameter to determine whether they are consistent with each other, and thereby the test can be accomplished.

In another embodiment, no magnetic strip signal generating module 2 is arranged inside the test apparatus. The magnetic card reading device acts as a magnetic strip signal generating module 2 and the magnetic card reading device is connected to the signal combining module 3 of the apparatus via a transmission line. In particular, the magnetic card reading device reads the magnetic card information and generates the original magnetic strip signal of the magnetic card, and then sends the original magnetic strip signal to the signal combining module 3 via the transmission line between the magnetic card reading device and the test apparatus.

Figure 3:
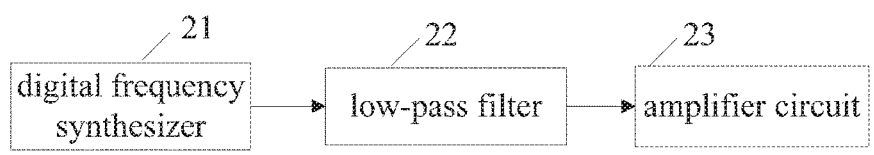
FIG. 3 is a schematic diagram of an embodiment of the magnetic strip signal generating module of the apparatus for detecting anti-skimming electromagnetic interference according to the present invention.

Still further, as shown in FIG. 3 which is the schematic diagram of an embodiment of the magnetic strip signal generating module of the apparatus for detecting anti-skimming electromagnetic interference according to the present invention, the magnetic strip signal generating module 2 comprises a digital frequency synthesizer 21, a low-pass filter 22 and an amplifier circuit 23;

the digital frequency synthesizer 21 has a controlling terminal and an analog signal output port;

the controlling terminal of the digital frequency synthesizer 21 is the controlled terminal of the magnetic strip signal generating module 2, the analog signal output port of the digital frequency synthesizer 21 is connected to the input port of the low-pass filter 22, the output port of the low-pass filter 22 is connected to the input port of the amplifier circuit 23, and the output port of the amplifier circuit 23 is the output port of the magnetic strip signal generating module 2.

Preferably, the controller 1 is integrated with an internal storage for storing the original magnetic strip parameter. The controller 1 drives the digital frequency synthesizer 21 to work and send the original magnetic strip parameter to a register in the digital frequency synthesizer 21, the digital frequency synthesizer 21 generates an analog magnetic strip signal according to the value stored in the register. The analog magnetic strip signal is filtered and shaped by the low-pass filter 22 and the voltage of the signal is amplified to a pre-determined magnitude by the amplifier circuit 23, and thereby the magnetic strip signal is generated.

Preferably, the frequency, phase and magnitude of the output signal can be controlled by setting the register values in the internal register of the digital frequency synthesizer 21.

Preferably, an amplifier circuit is included inside the magnetic strip decoding module 5 and it can amplify the received magnetic strip signal so as to facilitate the subsequent decoding of the magnetic strip signal.

Further, the test apparatus also comprises a noise filter 6; the combined signal output port of the signal combining module 3 is connected to the input port for the signal to be decoded of the magnetic strip decoding module 5 through the noise filter 6, and thereby the noise inference of the signal to be decoded can be filtered out and the probability of decoding success can be promoted, subsequently, the test accuracy of the apparatus can be raised.

Still further, the test apparatus also comprises an A/D converter 7 which has an analog signal input port and a digital signal output port; the controller 1 also has a digital signal input port.

The analog signal input port of the A/D converter 7 is connected to the signal output port of the noise filter 6 or the interference signal output port of the electromagnetic interference receiver 4, and the digital signal output port of the A/D converter 7 is connected to the digital signal input port of the controller 1. The interference signal can be transmitted to the A/D converter 7 for conversion by the two preceding means, wherein as long as the signal input to the signal combining module 3 is not the original magnetic strip signal, the signal input into the magnetic strip decoding module 5 is an interference signal when the analog signal input port of the A/D converter 7 is connected to the input port for signal to be decoded of the magnetic strip decoding module 5. In another means, the interfered magnetic strip signal is transmitted to the A/D converter 7 for conversion and the A/D converter 7 outputs the magnitude values of this signal (digitalized values) to the controller, and the controller samples the magnitude values to obtain the average value thereof. If the signal is converted by the A/D converter 7 is the interfered magnetic strip signal, the controller can convert the average value to the interference strength of the signal sent out by the electromagnetic interference source on the basis of a first criterion (because the interfered magnetic strip signal is generated by combining the interference signal and the original magnetic strip signal, the first criterion should take the signal strength of the original magnetic strip signal into consideration). Otherwise, if the signal is converted by the A/D converter 7 is the interference signal, the controller can convert the average value into the interference strength of the signal sent by the electromagnetic interference source on the basis of a second criterion.

Yet further, the test apparatus also comprises a display controlling module 8 which further comprises a keyboard device 81 and a display screen 82;

the controller 1 has a detected signal input port connected to the keyboard device 81 and a display output port connected to the display screen 82, the detected signal can be received by the keyboard 81 of the display controlling module 8 and the test result and the interference strength of the electromagnetic interference source can be displayed on the display screen 82.

It should be noted that the test apparatus further comprises a power supply that provides power for the whole test apparatus.

By utilizing the test apparatus of the embodiment of the present invention, the original magnetic strip signal is generated through simulation, and then the original magnetic strip signal is combined with the interference signal from the electromagnetic interference source to obtain the interfered magnetic strip signal, next, the interfered magnetic strip signal can be decoded and thereby the decoded parameter can be obtained. Finally, whether the original magnetic strip parameter corresponding to the original magnetic strip signal is consistent with the decoded parameter can be determined, and thereby whether the electromagnetic interference source is capable of satisfying the magnetic card reading device's requirement for electromagnetic interference can be accurately tested. In this way, further improvement of the electromagnetic interference source can be facilitated, the security of the magnetic card reading device can be enhanced and the magnetic card can be protected from being skimmed.

It can be understood by those skilled in the art that the whole or parts of the process of the method in the above embodiment can be realized by computer program instructing related hardware, the computer program is stored in a computer readable storage medium, when the program is executed, it can include such as process of the embodiment of the above each method.

The storage media may be a magnetic disc, optical disc, Read-Only Memory (ROM), Random Access Memory (RAM), etc.

The descriptions above are just preferred embodiments of the invention, it should be noted that the alterations and modifications without departing from the spirit of this invention shall fall in the scope of the present invention to those skilled in the art.

What is claimed is:

1. A method for detecting anti-skimming magnetic interference, comprising the steps of:
   generating an original magnetic strip signal;
   acquiring an interfered magnetic strip signal by combining the original magnetic strip signal and an interference signal of an electromagnetic interference source to be tested;
   decoding the interfered magnetic strip signal to obtain a decoded parameter; and
   determining whether an original magnetic strip parameter corresponding to the original magnetic strip signal is consistent with the decoded parameter; if so, obtaining a first test result that the electromagnetic interference source is unqualified to satisfy a magnetic card reading device's requirement for electromagnetic interference; otherwise, obtaining a second test result that the electromagnetic interference source is qualified to satisfy the magnetic card reading device's requirement for electromagnetic interference.

2. The method for detecting anti-skimming magnetic interference according to claim 1, characterized in that the step of acquiring the combined interfered magnetic strip signal particularly comprises the steps of:
   acquiring the interference signal sent out by the electromagnetic interference source to be tested;
   combining the original magnetic strip signal and the interference signal so as to obtain the interfered magnetic strip signal.

3. The method for detecting anti-skimming magnetic interference according to claim 2, characterized in that the method further comprises the steps of:
   performing A/D conversion on the interference signal of the electromagnetic interference source to be tested in order to obtain digitalized values of the interference signal;
   computing an average voltage value according to the digitalized values of the interference signal;
   determining interference strength of the electromagnetic interference source according to the average voltage value.

4. The method for detecting anti-skimming magnetic interference according to claim 3, characterized in that the method further comprises the step of displaying the first or second test result and/or the interference strength.

5. The method for detecting anti-skimming magnetic interference according to claim 2, characterized in that the original magnetic strip signal is generated according to a pre-stored original magnetic strip parameter or is acquired by the magnetic card reading device.

6. The method for detecting anti-skimming magnetic interference according to claim 1, characterized in that the original magnetic strip signal is generated according to a pre-stored original magnetic strip parameter or is acquired by the magnetic card reading device.

7. An apparatus for detecting anti-skimming electromagnetic interference, comprising: a controller, a magnetic strip signal generating module, an electromagnetic interference receiver, a signal combining module and a magnetic strip decoding module;
   the magnetic strip signal generating module is connected to the controller and is configured to generate an original magnetic strip signal and send the original magnetic strip signal to the signal combining module;
   the electromagnetic interference receiver is configured to acquire the interference signal sent by the electromagnetic interference source to be tested and send the interference signal to the signal combining module;
   the signal combining module is connected to the magnetic strip signal generating module and the electromagnetic interference receiver respectively, and is configured to combine the original magnetic strip signal and the interference signal received so as to acquire the interfered magnetic strip signal and send the interfered magnetic strip signal to the magnetic strip decoding module;
   the magnetic strip decoding module is connected to the signal combining module, and is configured to receive the interfered magnetic strip signal, decode the interfered magnetic strip signal and then send the decoded parameter to the controller;
   the controller is connected to the magnetic strip decoding module, and is configured to receive the decoded parameter and determine whether the original magnetic strip parameter corresponding to the original magnetic strip signal is consistent with the decoded parameter; if so, obtaining a first test result that the electromagnetic interference source is unqualified to satisfy a magnetic card reading device's requirement for electromagnetic interference, otherwise, obtaining a second test result that the electromagnetic interference source is qualified to satisfy the magnetic card reading device's requirement for electromagnetic interference.

8. The apparatus for detecting anti-skimming electromagnetic interference according to claim 7, characterized in that the magnetic strip signal generating module comprises a digital frequency synthesizer, a low-pass filter and an amplifier circuit;
   a control terminal of the digital frequency synthesizer is configured to be connected to the controller, an analog signal output port of the digital frequency synthesizer is connected to an input port of the low-pass filter, an output port of the low-pass filter is connected to an input port of the amplifier circuit, and an output port of the amplifier circuit is connected to the signal combining module;
   or the magnetic strip signal generating module is a magnetic card reading device.

9. The apparatus for detecting anti-skimming electromagnetic interference according to claim 8, characterized in that the apparatus also comprises a display controlling module, the display controlling module further comprises a keypad device and a display screen;
   the controller has a detected signal input port and a display output port; the detected signal input port of the controller is connected to the keyboard device while the display output port of the controller is connected to the display screen.

10. The apparatus for detecting anti-skimming electromagnetic interference according to claim 7, characterized in that the test apparatus further comprises a noise filter, and the magnetic strip decoding module is connected to the signal combining module via the noise filter.

11. The apparatus for detecting anti-skimming electromagnetic interference according to claim 10, characterized in that the apparatus further comprises an A/D converter having an analog signal input port and a digital signal output port;
   the analog signal input port of the A/D converter is connected to an output port of the noise filter or the interference signal output port of the electromagnetic interference receiver, the digital signal output port of the A/D converter is connected to the controller.

12. The apparatus for detecting anti-skimming electromagnetic interference according to claim 11, characterized in that the apparatus also comprises a display controlling module, the display controlling module further comprises a keypad device and a display screen;
    the controller has a detected signal input port and a display output port; the detected signal input port of the controller is connected to the keyboard device while the display output port of the controller is connected to the display screen.

13. The apparatus for detecting anti-skimming electromagnetic interference according to claim 10, characterized in that the apparatus also comprises a display controlling module, the display controlling module further comprises a keypad device and a display screen;
    the controller has a detected signal input port and a display output port; the detected signal input port of the controller is connected to the keyboard device while the display output port of the controller is connected to the display screen.

14. The apparatus for detecting anti-skimming electromagnetic interference according to claim 7, characterized in that the apparatus also comprises a display controlling module, the display controlling module further comprises a keypad device and a display screen;
    the controller has a detected signal input port and a display output port; the detected signal input port of the controller is connected to the keyboard device while the display output port of the controller is connected to the display screen.

\* \* \* \* \*